(12) United States Patent
Huang

(10) Patent No.: US 6,930,389 B2
(45) Date of Patent: Aug. 16, 2005

(54) UNDER BUMP METALLIZATION STRUCTURE OF A SEMICONDUCTOR WAFER

(75) Inventor: Min-Lung Huang, Kaohsiung (TW)

(73) Assignee: Advanced Semiconductor Engineering, Inc., Kaoshiung (TW)

(*) Notice: Subject to any disclaimer, the term of this patent is extended or adjusted under 35 U.S.C. 154(b) by 0 days.

(21) Appl. No.: 10/820,829

(22) Filed: Apr. 9, 2004

(65) Prior Publication Data
US 2004/0262755 A1 Dec. 30, 2004

(30) Foreign Application Priority Data
Jun. 30, 2003 (TW) .................................. 92117895 A

(51) Int. Cl.⁷ .................. H01L 23/48; H01L 23/52; H01L 29/40
(52) U.S. Cl. .................. 257/737; 257/738; 438/613
(58) Field of Search .............................. 257/737, 738; 438/613, 614

(56) References Cited

U.S. PATENT DOCUMENTS

2003/0189260 A1 * 10/2003 Tong et al. .................. 257/778
2004/0238955 A1 * 12/2004 Homma et al. ............. 257/737

* cited by examiner

Primary Examiner—Phat X. Cao
(74) Attorney, Agent, or Firm—Bacon & Thomas

(57) ABSTRACT

An under bump metallurgy structure is applicable to be disposed above the wafer and on the bonding pads of the wafer. The wafer comprises a passivation layer and an under bump metallurgy structure. The passivation layer exposes the wafer pads, and the under bump metallurgy structure including an adhesive layer, a first barrier layer, a wetting layer and a second barrier layer are sequentially formed on the bonding pads. Specifically, the material of the second barrier mainly includes lead.

10 Claims, 2 Drawing Sheets

UNDER BUMP METALLIZATION STRUCTURE OF A SEMICONDUCTOR WAFER

BACKGROUND OF THE INVENTION

1. Field of Invention

This invention relates to an under bump metallization structure of a semiconductor wafer. More particularly, the present invention is related to an under bump metallization structure of a wafer for enhancing the mechanical strength of the connection of the bonding pads to the wafer and the solder bumps.

2. Related Art

In this information explosion age, integrated circuit products are used almost everywhere in our daily life. As fabricating technique continue to improve, electronic products having powerful functions, personalized performance and a higher degree of complexity are produced. Nowadays, most electronic products are relatively light and have a compact body. Hence, in semiconductor production, various types of high-density semiconductor packages, for example ball grid array package (BGA), chip-scale package (CSP), multi-chips module package (MCM) and flip chip package (F/C), have been developed.

However, as mentioned above, flip chip is one of the most commonly used techniques for forming an integrated circuits package. Compared with a wire-bonding package or a tape automated bonding (TAB) package, a flip-chip package uses a shorter electrical path on average and has a better overall electrical performance. In said flip-chip package, the bonding pads on a chip and the contacts on a substrate are connected together through a plurality of bumps formed by the method of bumping process. It should be noted that there is further an under bump metallization structure disposed on the bonding pads of the chip to be regarded as a connection medium for connecting to the bumps and enhancing the mechanical strength of the connection of the chip to the substrate after said chip is attached to the substrate.

Referring to FIG. 1, it illustrates a partially cross-sectional view of a conventional semiconductor wafer 100. The semiconductor wafer 100 has a passivation layer 102 and a plurality of bonding pads 104 exposed out of the passivation 102. Besides, there is an under bump metallization structure 106, which is interposed between the bonding pads 104 and the solder bumps 108, regarded as a connection medium.

Referring to FIG. 1 again, as mentioned conventional under bump metallization layer 106 mainly comprises an adhesive layer 106a, a barrier layer 106b and a wetting layer 106c. The adhesive layer 106a is utilized to enhance the mechanical strength of the connection of the bonding pad 104 to the barrier layer 106b, wherein the material of the adhesive layer 106a is made of aluminum or titanium. The barrier layer 106b is utilized to avoid the diffusion of the underlying metal, wherein the material of the barrier layer 106b usually includes nickel-vanadium alloy, nickel-copper alloy and nickel. In addition, the wetting layer 106c, for example a copper layer, is utilized to enhance the wettability of the solder bump 108 with the under bump metallization structure 106. It should be noted that tin-lead alloy is usually taken as the material of the solder bump 108 due to its good mechanical strength of the connection of the chip to the substrate, when the chip included in the semiconductor wafer 100 is singulated into individual ones and then mounted on the substrate. However, lead is a hazard and poisoned material so lead-free alloy becomes the mainstream material of the solder bump 108.

Referring to FIG. 1 again, when the wetting layer 106c comprises copper or is only made of copper, tin provided in the solder bumps 108 is easily reacted with copper to form an inter-metallic compound at the duration of reflowing solder bumps 108. Namely, an inter-metallic compound, $Cu_6Sn_5$, is formed and interposed between the wetting layer 106c and the solder bumps 108. Besides, when the barrier layer 106b comprises nickel-vanadium alloy, nickel-copper alloy and nickel, tin provided in the solder bumps 108 further reacts with nickel provide in the barrier layer 106b to form another inert-metallic compound, i.e. $Ni_3Sn_4$, after the inter-metallic compound, $Cu_6Sn_5$, is formed. It should be noted that the inter-metallic compound, i.e. $Ni_3Sn_4$, formed between the under bump metallization structure 106 and the bumps 108 under the long-term reaction of tin and nickel has a plurality of discontinuous blocks, which make the solder bumps 108 peel off from the under bump metallization structure 106 more easily.

Therefore, providing another method for forming bumps to solve the mentioned-above disadvantages is the most important task in this invention.

SUMMARY OF THE INVENTION

In view of the above-mentioned problems, an objective of this invention is to provide an under bump metallization structure formed between the bonding pads and the solder bumps to slow down the formation of inter-metallic compound, i.e. discontinuous blocks, in the barrier layer so as to enhance the bonding strength of the bumps to the bonding pads and the reliability of said bumped wafer or bumped chips.

To achieve these and other advantages and in accordance with the purpose of the invention, as embodied and broadly described herein, the invention provides an under bump metallization structure disposed between bonding pads and solder bumps which comprises tin. Therein, the under bump metallization structure at least comprises an adhesive layer disposed on the bonding pads, a first barrier layer formed on the adhesive layer, a wetting layer disposed on the first barrier layer, and a second barrier formed on the wetting layer. It should be noted that the second barrier layer can slow down the formation of the inter-metallic compound in the interface between the first barrier layer and the wetting layer due to the material of the second barrier layer mainly comprising lead and tin so as to prevent discontinuous blocks, i.e. $Ni_3Sn_4$, from being formed in the first barrier layer of the under bump metallization structure. In such a manner, it will prevent the solder bumps from peeling off from the under bump metallization structure.

It is to be understood that both the foregoing general description and the following detailed description are exemplary, and are intended to provide further explanation of the invention as claimed.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

Figure 1:
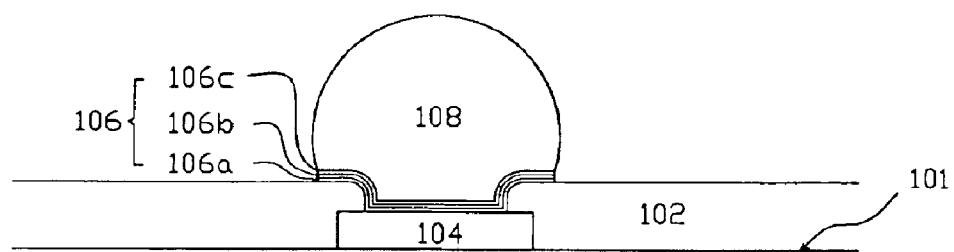
FIG. 1 illustrates a partially cross-sectional view of a conventional under bump metallization structure formed on bonding pads of a semiconductor wafer.

The under bump metallization structure of a semiconductor wafer according to the preferred embodiments of this invention will be described herein below with reference to the accompanying drawings, wherein the same reference numbers are used in the drawings and the description to refer to the same or like parts.

Figure 2:
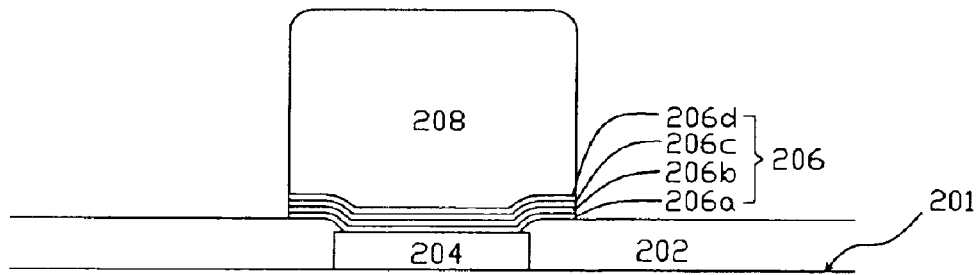
FIG. 2 illustrates a partially cross-sectional view of the under bump metallization structure formed on bonding pads of a semiconductor wafer according to the first preferred embodiment.

FIG. 2 are partially enlarged cross-sectional views showing the under bump metallization structure of a semiconductor wafer according to the first preferred embodiment.

As shown in FIG. 2, a semiconductor wafer 200 having a passivation layer 202 and a plurality of bonding pads 204. Therein, the passivation layer 202 covers the active surface 201 of the semiconductor wafer 200 and exposes the bonding pads 204; and the under bump metallization structure 206 comprising an adhesive layer 206a, a first barrier layer 206b, a wetting layer 206c and a second barrier layer 206d is formed on the bonding pads 204. When the bonding pads 204 are made of aluminum, preferably, the adhesive layer 206a, the first barrier layer 206b and the wetting layer 206c are an aluminum layer, a nickel-vanadium layer and a copper layer, respectively. In addition, when the bonding pads 204 are made of copper, preferably, the adhesive layer 206a, the first barrier layer 206b and the wetting layer 206c are a titanium layer, a nickel-vanadium layer and a copper layer, respectively. However, no matter which material of the adhesive layer 206a, the first barrier layer 206b and the wetting layer 206c are made, generally speaking, the adhesive layer 206a, the first barrier layer 206b and the wetting layer 206c mainly comprise titanium, tungsten, titanium-tungsten alloy, chromium, aluminum, nickel, nickel-vanadium alloy, nickel-copper alloy, nickel-titanium, and chromium-copper alloy, and are formed by the process of sputter or electro-plating.

Next, referring to FIG. 2 again, the material of the second barrier layer 206d formed on the wetting layer 206c mainly comprises lead. Specifically, the second barrier layer 206d is a lead layer or a tin-lead alloy layer, such as a high-lead solder layer, which is composed of lead and tin and the ratio of the lead and the tin in weight is ninety-five to five (95:5), ninety-seven to three (97:3) or ninety to ten (90:10). Moreover, the thickness of the second barrier layer 206d is at least larger than fifty (50) μm. Preferably, the thickness of the second barrier layer 206d is ranged between about fifty (50) μm and eighty (80) μm.

As mentioned above, the solder bumps 208 is formed on the second barrier layer 206d. Namely, the solder bumps 208 are directly disposed on the high-lead layer or the lead layer. In such a manner, when the solder bumps 208 are reflowed to securely attach on the under bump metallization structure 206, tin provided in the solder bumps 208 is firstly reacted with the lead provided in the second barrier layer 206d, and then reacted with the wetting layer 206c and the first barrier layer 206b below the second barrier layer 206d. Accordingly, tin is not easily directly reacted with copper provided in the wetting layer 206c so as to slow down the reaction of tin with copper. Furthermore, the second barrier layer 206d comprises lower ratio of tin so as to lower the ratio of tin in weight when the solder bumps 208 are reflowed and reacted with the second barrier layer 206d of the under bump metallization structure 206. Accordingly, neither tin is easily directly reacted with copper provided in the wetting layer 206c nor tin is easily directly reacted with nickel provided in the first barrier layer due to the lower concentration of tin.

As specified in the above, most of tin is able to be fully reacted with the second barrier layer 206d and the wetting layer 206c before reacting with the first barrier layer 206b due to lower concentration of tin, so as to avoid exceeding tin reacting with the first barrier layer 206b to form discontinuous blocks at the interface between the first barrier layer 206b and the adhesive layer 206a under long-term reaction. Thus, it can enhance the bonding strength of the bumps 208 to the under bump metallization structure 206 and prevent the bumps 208 from peeling off from the under bump metallization structure 206.

Accordingly, from the above-mentioned, this invention is characterized in that an under bump metallization structure having a lead layer, a high-lead solder alloy layer or a layer comprising lead therein taken as another barrier layer is directly formed on the bonding pads of the wafer and connected to the bumps. Therein, the lead layer may be composed of lead only, and the high-lead solder layer may be composed of lead and tin, wherein the ratio of the lead and the tin in weight is ninety-five to five (95:5), ninety-seven to three (97:3) or ninety to ten (90:10) so as to avoid tin reacting with the first barrier layer 206b to form discontinuous blocks, i.e. $Ni_3Sn_4$, at the interface between the first barrier layer 206b and the adhesive layer 206a under long-term reaction. Thus, it can enhance the bonding strength of the bumps 208 to the under bump metallization structure 206 and prevent the bumps 208 from peeling off from the under bump metallization structure 206.

Figure 3A:
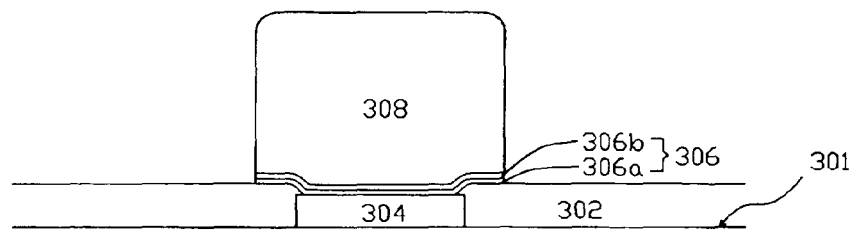
FIG. 3A illustrates a partially cross-sectional view of the under bump metallization structure formed on bonding pads of a semiconductor wafer according to the second preferred embodiment.

Moreover, a second preferred embodiment is provided as shown in FIG. 3A. Therein, the under bump metallization structure 306 of this invention according to the second embodiment may comprise two electrically conductive layers 306a and 306b. A first electrically conductive layer 306a at least comprises nickel and a second electrically conductive layer 306b mainly comprises lead wherein the first electrically conductive layer 306a is directly formed on the bonding pads 304 and the second electrically conductive layer 306b is directly connected to the bumps 308.

Figure 3B:
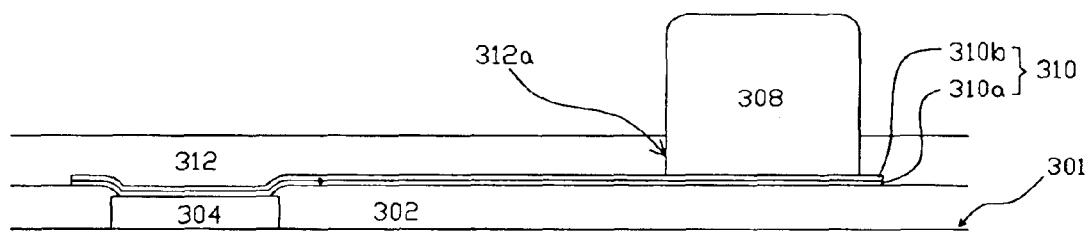
FIG. 3B illustrates a partially cross-sectional view of the under bump metallization structure formed on bonding pads of a semiconductor wafer according to the third preferred embodiment.

Furthermore, per mentioned above, when the under bump metallization structure is extended over the active surface 301 of the semiconductor wafer 300 to be taken as a third embodiment of this invention, said under bump metallization structure are taken as a redistributed structure 310 (as shown in FIG. 3B). It should be noted that a portion of the redistributed structure 310 is exposed out of the passivation layer 312 through the opening 312a to be regarded as a redistributed pad and the upper layer of the redistributed pad is mainly made of lead or high-lead solder. Therein, the redistributed structure 310 comprises a first electrically conductive layer 310a and a second electrically conductive layer 310b for connecting the bumps 308, and the passivation layer 312 may be formed of a polymer material, such as polyimide and Benzocyclobutence (BCB).

Although the invention has been described in considerable detail with reference to certain preferred embodiments, it will be appreciated and understood that various changes and modifications may be made without departing from the spirit and scope of the invention as defined in the appended claims.

What is claimed is:

1. An under bump metallization structure applicable to be disposed on bonding pads of a semiconductor wafer, wherein a passivation layer covers the wafer and exposes the bonding pads, the under bump metallization structure comprising:

an adhesive layer formed on the bonding pads;
a first barrier layer disposed on the adhesive layer;
a wetting layer formed on the first barrier layer; and
a second barrier layer disposed on the wetting layer, wherein a material of the second barrier comprises lead.

2. The structure of claim 1, wherein the material of the second barrier layer is made of lead and tin.

3. The structure of claim 2, wherein the ratio of the lead and the tin in weight is substantially ninety-five to five.

4. The structure of claim 2, wherein the ratio of the lead and the tin in weight is substantially ninety-seven to three.

5. The structure of claim 2, wherein the ratio of the lead and the tin in weight is substantially ninety to ten.

6. The structure of claim 1, wherein the first barrier layer is a nickel-vanadium layer.

7. The structure of claim 1, wherein the wetting layer is a copper layer.

8. The structure of claim 1, wherein the wetting layer is a nickel layer.

9. The structure of claim 1, wherein the wetting layer is a titanium layer.

10. The structure of claim 1, wherein the thickness of the second barrier layer is ranged from about 50 $\mu$m to about 80 $\mu$m.

* * * * *